United States Patent [19]

Koskowich

[11] Patent Number: 5,168,245
[45] Date of Patent: Dec. 1, 1992

[54] MONOLITHIC DIGITAL PHASELOCK LOOP CIRCUIT HAVING AN EXPANDED PULL-IN RANGE

[75] Inventor: Gregory N. Koskowich, Bothell, Wash.

[73] Assignee: International Business Machines Corporation, Armonk, N.Y.

[21] Appl. No.: 784,849

[22] Filed: Oct. 30, 1991

[51] Int. Cl.⁵ .................. H03L 7/087; H03L 7/18
[52] U.S. Cl. ..................... 331/1 A; 331/11; 331/14; 331/17; 331/25
[58] Field of Search ............... 331/1 A, 10, 11, 12, 331/14, 17, 25

[56] References Cited

U.S. PATENT DOCUMENTS

| | | | |
|---|---|---|---|
| 4,131,861 | 12/1978 | Malaviya | 331/2 |
| 4,456,890 | 6/1984 | Carickhoff | 331/10 X |
| 4,531,102 | 7/1985 | Whitlock et al. | 331/11 X |
| 4,565,976 | 1/1986 | Campbell | 331/57 |
| 4,570,130 | 2/1986 | Grindel et al. | 331/8 |
| 4,799,028 | 1/1989 | Weaver et al. | 331/57 |
| 4,879,530 | 11/1989 | Wilhelm et al. | 331/45 |
| 4,908,582 | 3/1990 | Kawano et al. | 331/1 A |
| 4,920,322 | 4/1990 | Ruijs | 331/17 |
| 4,929,916 | 5/1990 | Fukuda | 331/1 |
| 4,942,370 | 7/1990 | Shingemori | 331/1 A |

*Primary Examiner*—Siegfried H. Grimm
*Attorney, Agent, or Firm*—Henri Daniel Schnurmann; Donald M. Boles

[57] ABSTRACT

A monolithic phaselock loop circuit (PLL) for controlling the phase and frequency of a VCO to compensate for process induced variations in the VCO natural frequency and to extend the pull-in range by ±50% of the frequency of a reference clock. The PLL is comprised of a VCO, a digital phase comparator, a digital frequency divider and a digital sequential phase error detector (SPED). The SPED circuit comprises two up-down counters, one to control the phase; the other, the frequency; a first one-shot circuit that drives the phase up-down counter to detect every level transition of the reference clock and a second one-shot circuit that drives the frequency up-down counter to provide a pulse for every falling edge of the reference clock; and a shift register responsive to the phase comparator to store the value of the phase comparator thereby providing indication of a frequency lock between the reference clock and the VCO.

12 Claims, 3 Drawing Sheets

MONOLITHIC DIGITAL PHASELOCK LOOP CIRCUIT HAVING AN EXPANDED PULL-IN RANGE

FIELD OF THE INVENTION

This invention relates, generally, to a monolithic digital sequential phase error detector circuit and more particularly to an improved lock-in range of a phaselock loop in order to compensate for process induced variations that affect the free-running frequency of a voltage controlled oscillator within a phaselock loop circuit.

BACKGROUND OF THE INVENTION

Phaselock loop circuits (PLL's) have routinely been used as part of conventional control circuitry with a wide range of applications, mainly in the field of communications. Circuits of this type have advantageously been implemented with analog components as the most effective way of providing the necessary functions. More recently though, PLL's have also been successfully implemented using digital circuitry.

The principles and applications of PLL's have been known for many years and referred to in a variety of patents and publications, some of which are listed below.

A detailed description of design techniques and operation of PLL's are described in a textbook by F. M. Gardner, "Phaselock Techniques", published by John Wiley & Sons, 1976.

A phase shifter VCO which includes amplifiers and difference amplifiers is described in U.S. Pat. No. 4,799,028 to Weaver et al, in which both the timing element and phase shifter oscillator are implemented with analog components.

A VCO used as integral part of an analog PLL has been described in U.S. Pat. No. 4,942,370 to Toshihiro Shigemori, whereby a PLL circuit is shown comprising a phase comparator for inputting input and output clock signals, for detecting differences in phase between both of these signals, and for outputting a signal based on the phase difference. These and other functions are provided by a phase comparator driving a proportional circuit and an integral circuit feeding the VCO.

Further representations of a VCO used jointly with an analog PLL is described in U.S. Pat. No. 4,920,322 to Jan B. F. W. Ruijs, in which a VCO is used in a phaselock loop which includes a phase detector for generating an error signal representative of a phase difference between a reference signal and a signal taken from the VCO, and a loop filter for producing a control signal from the error signal.

A further analog representation of a VCO used jointly with a PLL is described in U.S. Pat. No. 4,908,582 to Mitsumo Kawano, et al., in which an automatic frequency control circuit uses counters, flip flops and logic gates to control a VCO but leaves the VCO and adjoining PLL functionally in analog form. The same is also true for the Interruptible VCO and PLL described in U.S. Pat. No. 4,565,976 to David L. Campbell which are of the analog type, thereby using continuously variable voltage signals for controlling the frequency of the VCO.

In U.S. Pat. No. 4,570,130 to David R. Grindel, et al and of common assignee, an analog PLL oscillator is provided with a VCO which includes a current controlled oscillator and an input controller therefor that maintains the center frequency of the current controlled oscillator substantially constant regardless of changes in the gain of the VCO. Grindel provides a VCO with improved center of frequency vs control voltage characteristics using appropriate analog functions implemented with analog components.

It has been found that with the ever increasing number of transistors available in monolithic integrated circuits, a trend has developed towards replacing analog functions with digital elements. This process has mainly been driven by cost reductions inherent in monolithic implementations. Complicating this process has been a desire of the device designer to optimize the device/process for digital IC performance. This optimization is frequently at odds with implementing precision analog functions using the same technology.

None of the above references attempt to solve a distinct problem germane to monolithic integrated circuits, whereby precise control of processing parameters is not possible nor feasible, leading to aberrations in the operation of a PLL and VCO associated with it.

It is known, particularly in communication applications, that it is desirable to correlate the frequency of a clock to a frequency many times that of an input reference clock. Since it is presently not feasible to guarantee that a monolithic oscillator will generate an exact frequency due to process and environmental variations, a precise control mechanism is required to adjust the frequency and phase.

A common technique to achieve phase and frequency control of an oscillator is to embed a controllable oscillator in a PLL which forces it to track the frequency and phase of the input reference. To perform a frequency multiplication as desired, the output of an on-chip oscillator must be divided by a predetermined factor, e.g., 10 in frequency. It is this reduced frequency which can be used by the PLL to lock the reference input.

To further understand the operation of a PLL and the control of certain key parameters, the following definitions are required:

A Lock-in Range refers to how close an input frequency must be to the VCO free-running frequency before the feedback loop (or loop, in short) acquires phase lock with no cycle slips.

A Pull-in Range is defined as the frequency range over which the loop will follow changes in the input frequency. More specifically, it refers to how far the input frequency can deviate from the VCO free running frequency.

A simple first-order loop is characterized by a single parameter called the loop gain K, which determines the lock-in and pull-in ranges, in accordance with the following relationship:

$$2\pi\text{lock-in range} 2 = \pi\text{pull-in range} = K.$$

A more precise control of the lock-in capability of a PLL can be achieved by incorporating a Sequential Phase Error Detector (SPED) circuit in the feedback loop of the PLL. The SPED circuit greatly facilitates the design of a PLL by allowing it to "pull-in" over a wider range of frequencies. It also compensates for deviations that normally occur in the free running frequency of the VCO due to process variations, while simultaneously providing low-jitter operation which is essential for low error rates.

OBJECTS OF THE INVENTION

Accordingly, it is an object of the present invention to provide an essentially digital PLL with improved phase and frequency tracking capabilities of an input reference signal of fixed frequency.

It is a further object of the present invention to include a Sequential Phase Error Detector (SPED) in the feedback loop of the PLL capable of extending the pull-in range by approximately ±50% of the frequency of the reference clock signal.

It is another object of the invention to use digital components in the SPED circuit to achieve maximum uniformity and integrity of a monolithic integrated circuit.

It is yet another object of the present invention to achieve an improved degree of precision regardless of manufacturing process variations.

SUMMARY OF THE INVENTION

The aforementioned objects are achieved according to the present invention by a phaselock loop circuit for locking the phase and the frequency of a voltage controlled oscillator to a free-running oscillator, comprising: a voltage controlled oscillator (VCO) for creating a signal at a VCO output terminal thereat of predetermined frequency; a digital phase comparator for comparing the phase of the VCO output signal to the phase of a signal generated by the free-running oscillator, said comparator having a first input responsive to the free-running oscillator and an output which controls the VCO; and a digital sequential phase error detector (SPED) circuit having a first input adapted to receive the signal of the free-running oscillator and having a second input connected to the VCO output terminal, the SPED circuit extending the pull-in range of the phaselock loop circuit by at least ±50% of the frequency of the free-running oscillator.

The foregoing and other objects, features and advantages of the invention will become apparent from a consideration of the following detailed description of the preferred embodiment of the invention and as illustrated in the accompanying Figures.

DESCRIPTION OF THE PREFERRED EMBODIMENT

Figure 1:
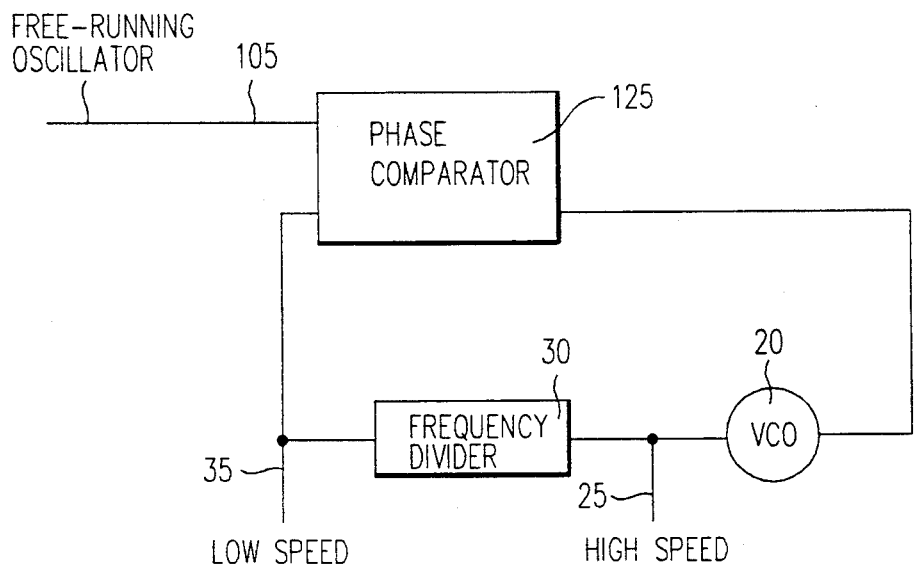
FIG. 1 is a schematic diagram shown in block form illustrating a prior art analog phaselock loop (PLL)

Referring to FIG. 1, there is shown a block diagram illustrating a prior art first order analog PLL indicated by reference number 1, that includes a free-running VCO 20.

Conventional elements of a PLL are a phase comparator 125, a loop filter (not shown), and a frequency divider 30 as part of the feedback loop that includes the VCO 20. Phase comparator 10 generates a voltage level proportional to the phase difference of the VCO 20 output and the reference input clock 105 (not shown). The PLL implements a negative feedback control system which uses the phase comparator 125 output voltage to drive the VCO 20, such that the VCO output frequency is locked in its phase and frequency to the reference clock signal 105. A high-speed and low speed terminal are provided by tapping each side of the frequency divider circuit 30, and shown by lines 25 and 35, respectively.

Figure 2:
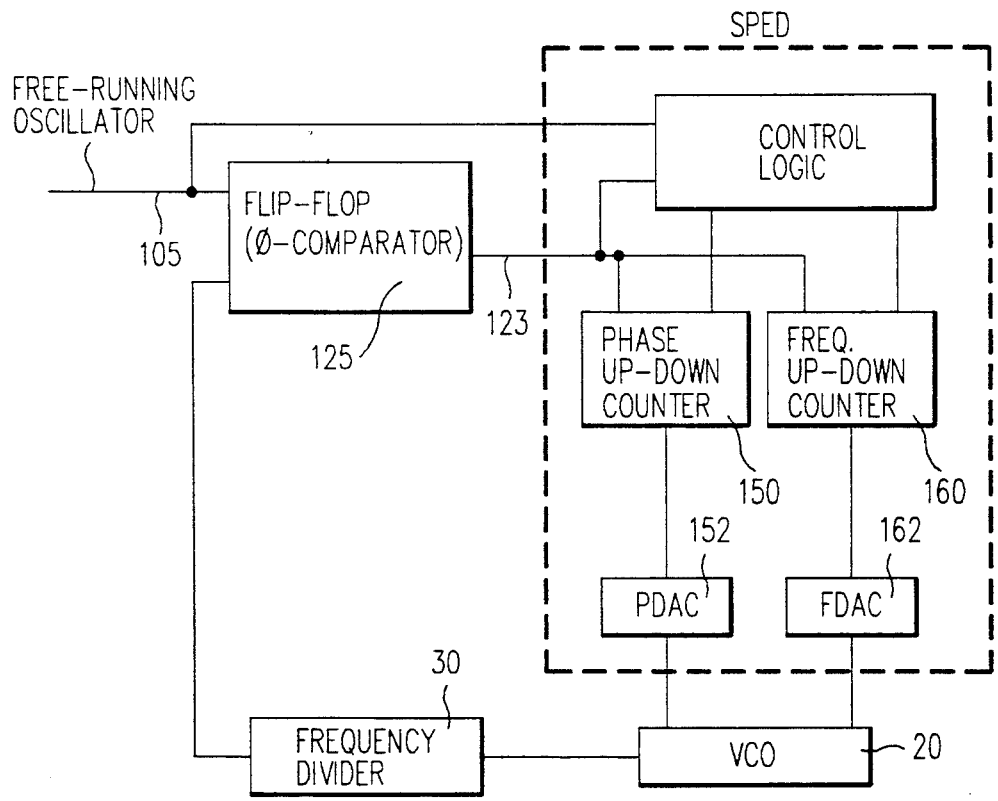
FIG. 2 is a schematic diagram shown in block form illustrating the preferred embodiment of a PLL in accordance with the present invention.

Referring now to FIG. 2, which shows a block diagram of a first order digital phaselock loop (PLL) according to the present invention. A flip-flop 125 digitally performs the analog operation of a phase comparator by holding a lead or lag signal on the falling transition. If the VCO 20 lags behind the frequency of the reference input signal, the counter 150 increments its count, which in turn increments the frequency of the VCO. Conversely, if the frequency of the VCO 20 leads that of the reference signal, the counter decrements its count, thereby reducing the frequency of the VCO. In this configuration, the equivalent to K, the analog loop gain parameter, is determined by the frequency increment of the digitally controlled oscillator. Similarly, the lock-in range and pull-in range for this digital implementation are the same and are illustrated in FIG. 3.

Figure 3:
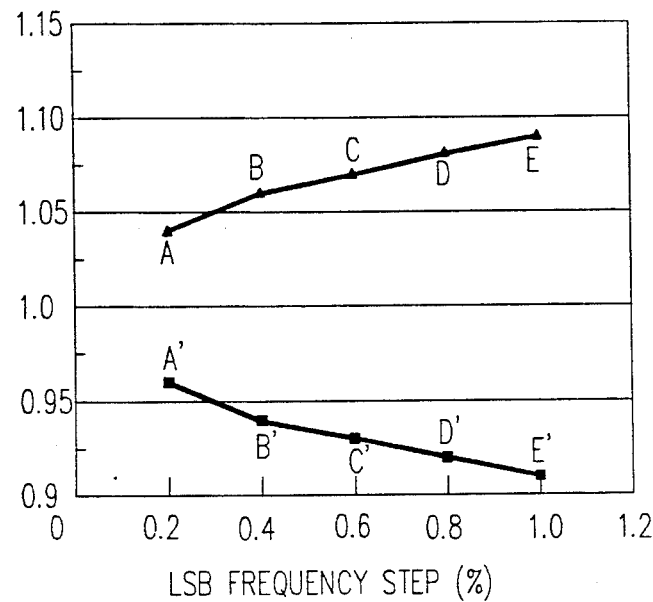
FIG. 3 shows a diagram of the Lock-in Range for a digital PLL, in which the Normalized Lock-in Range is plotted on the y-axis and the Least Significant Bit frequency change which affects the frequency of the VCO oscillator expressed in percentage points, is plotted on the x-axis.

FIG. 3 shows a plot of the upper and lower bounds of the frequencies over which a PLL can lock-in, for any normalized frequency between 90% and 115%. The x-axis is the Least Significant Bit (LSB) frequency step of the VCO expressed in percentage points, whereas the y-axis shows the normalized lock-in range. Thus, referring to the various upper and lower boundary points representing lock-in values, they are shown to occur between 110 and 91% (points E and E'), 108 and 92% (points D and D'), 107 and 93% (points C and C'), 106 and 94% (points B and B'), and 104 and 96% (points A and A'), respectively.

First order PLL's suffer from a serious drawback which greatly limits their usefulness in many applications. The ability to adjust only one parameter, namely, the loop gain K, causes a designer to trade-off jitter (i.e., noise) performance to accommodate a wider lock-in range and, hence, a wider pull-in range. Thus, for a low jitter (or low loop gain) system, control of the VCO natural frequency must be extremely tight so that it will fall within the lock-in range of the PLL.

To circumvent the small pull-in range, a loop filter is incorporated in an analog PLL which integrates the output of the phase comparator or phase detector. When the PLL is cycle slipping, i.e., it is out of its lock-in range, the phase detector (or phase comparator) operates in a non-linear mode. During this cycle slipping, the output of the phase detector has a DC component which indicates the direction of the frequency error. By integrating this DC component and using the resulting signal to control the VCO, a remarkable improvement results in the pull-in range. Both, the time constant and the gain loop filter are the two parameters that control the transient response characteristics during the pull-in process.

In a monolithic PLL implemented using a digital technology, the components that create a loop filter may not be implementable or may be too imprecise to satisfy chip yield goals. Hence, a digital technique which solves the limited pull-in range problem is highly desirable.

The Sequential Phase Error Detector according to the present invention solves this limited pull-in range problem by extending the pull-range by ±50% of the frequency of the input reference signal. (The input reference clock shall also be referred to henceforth as the free-running oscillator.)

Figure 4:
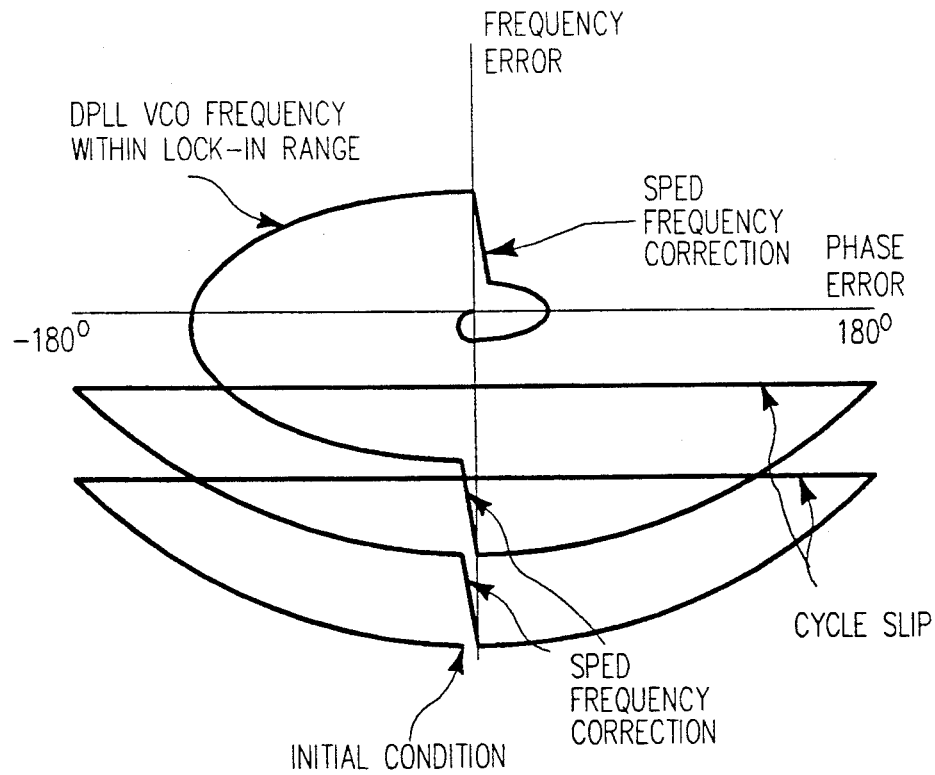
FIG. 4 shows a plot representing a Phase-plane analysis of a digital PLL that includes a digital Sequential Phase Error Detector (SPED)

The operation of the Sequential Phase Error Detector is best described by a phase-plane analysis technique, as shown in FIG. 4. Generally, a phase-plane analysis is routinely used to illustrate graphically the operation of a non-linear system. State variables are chosen to represent a system parameter and its time derivative, which correspond in the present invention, to the frequency and phase error signals in the PLL. The system follows a trajectory in the phase-plane as time evolves that clearly elucidates the relationship between the state variables. It is evident to those skilled in the art, that many trajectories may exist in the phase-plane analysis, although the system only follows one that is based on its initial phase and frequency. The action of the PLL is to force the VCO 20 (FIG. 2) to start at some arbitrary phase and frequency and converge to a zero frequency error and zero phase error. The trajectory shown in this phase-plane analysis has two distinct modes. The first occurs immediately after start-up and is characterized by large discontinuous phase swings which are indicative of cycle slips. The second has elliptical trajectories in the left and right halves, thereby indicating the absence of cycle slips, i.e., the phase error never reaches 180 degrees.

The Sequential Phase Error Detector (SPED) is active only while cycle slipping is occurring. During this mode, the phase detector output is comprised of a sequence of lead phase samples followed by a sequence of lag samples. SPED detects the transition between lead and lag samples which indicates that a zero phase error condition has just passed. When the zero phase error condition has been satisfied, the detector examines the quadrature clock to determine if a cycle slip has occurred during the lead-lag transition. If it has (e.g., when a falling reference clock edge is aligned to a rising VCO edge) no corrective action is taken. If no cycle slip exists (e.g., falling edges on the reference clock and the VCO are aligned) then the output of the phase detector indicates the direction which the coarse digital-to-analog DCC circuit 50 (FIG. 2) must be adjusted to. Lead/lag transitions are normally accompanied by alternating cycle slip events, as indicated by successive high and low levels on the quadrature clock, while the PLL is in a cycle slipping mode. If three successive lead/lag transitions are not associated with cycle slip events, then the VCO frequency remains within the lock-in range of the PLL. When three non-cycle slip events are detected, the SPED circuit freezes the frequency up-down counter (coarse adjustment) in its current state, thereby allowing the PLL to lock using the phase up-down counter (fine, adjustment). Detecting three non-cycle slip events, implies that the loop is locked-in and can subsequently be used as a lock indicator to an outside observer.

Figure 5:
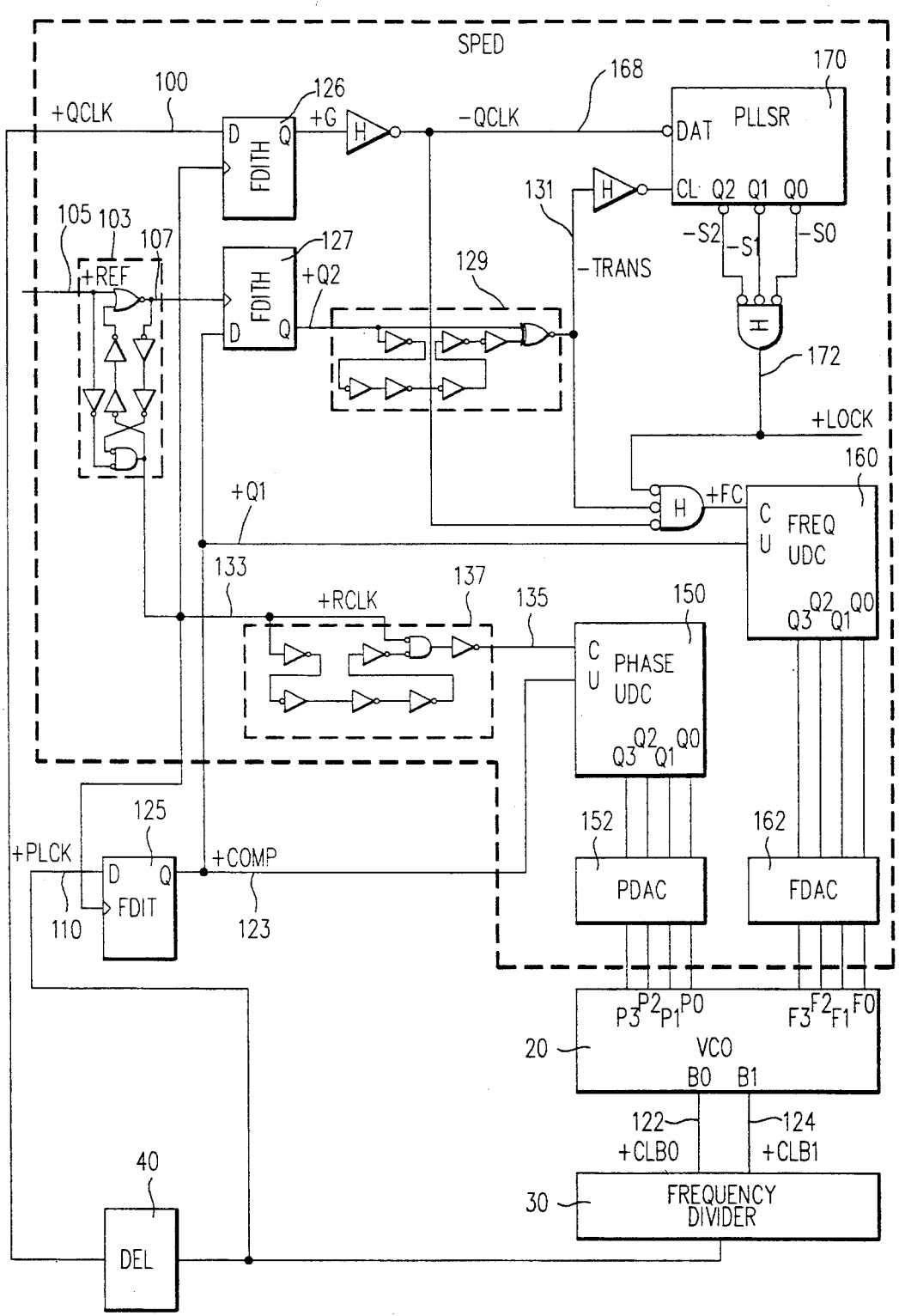
FIG. 5 illustrates a detailed logic diagram of the Sequential Phase Error Detector as part of a PLL in accordance with the present invention.

Referring now to FIG. 5, the Clock Generator or PLL is schematically shown.

The PLL is a monolithic phaselock loop which is used to generate an internal two phase non-overlapping clock (+CLB0 and +CLB1, lines 122 and 124, respectively) which drives a bit serializer of a Transmitter Integrated Circuit chip, commonly used in an High Speed Optical Link, and well known to those proficient in the art. The function of the PLL is to phaselock the internal digitally controlled oscillator (or VCO) to a reference clock provided by the system (+REF 105). The system clock operates at a byte rate of e.g., 40 MHZ, while the VCO operates at 400 MHZ, thereby enabling bit serialization at the desired bit rate (e.g., 10 bits/byte @80 Mbytes/sec = 800 Mbits/sec). To phaselock CLB0 122 and CLB1 124 to the reference clock input REF 105, the serializer divides the frequency by 10 and feeds back the in-phase and quadrature clocks at a byte rate of 40 MHZ. The two internally phaselocked signals +RCLK 133 and +PCLK 110, henceforth referred to as 'reference clock' and 'in-phase clock' allow the Clock Generator to adjust the VCO frequency and thereby synchronize the falling edges of these two signals.

Steady State Operation

The falling edge of +RCLK 133 samples the state of +PCLK 110 and stores this value at the latch 125 output +COMP. (Hereinafter, a latch shall be referred to interchangeably as flip-flop.) It also generates a negative pulse at line 135 starting two superbuffer logic gate delays after a falling edge of +RCLK 133 and ending five gate delays later, thereby clocking the phase up-down counter 150. If +COMP is high, then counter 150 counts up; conversely, if it is low, the counter counts down. This portion of the circuit implements a simple first order phaselock loop which, is mathematically unconditionally stable. The VCO must be designed to have enough range to compensate for temperature and power supply variations. Process variations result in a wide range of nominal VCO output frequency which are compensated by using digital control logic, as shown in FIG. 5.

Under steady state operation, the VCO is controlled by a phase DAC only with the +COMP signal assuming 0 or 1 values depending on the relative position of the falling edges of RCLK and PCLK in time. Since the phase counter 150 must increment or decrement on each RCLK falling edge, the VCO frequency will change by the Least Significant Bit (LSB) amount on each cycle. Since the probability that the VCO frequency will exactly equal the desired 400 MHZ at any DAC input value is zero, the VCO frequency will alternate between two values which bracket the desired 400 MHZ rate with a duty cycle proportional to the relative error of the two values.

In this mode of operation, no cycle slipping occurs, and the +COMP signal will assume both 1 and 0 values on successive samples. When +COMP changes from a 0 to a 1 or vice versa, the transition detector consisting of latch 127, and preferably, 6 inverters and 1 XNOR gate (block 129) generate a negative pulse at −TRANS 131. This pulse clocks the three bit shift register PLLSR (block 170) which stores the last 3 values of −QCLK 168. If the last three values of −QCLK 168 are low, then the PLL is considered to be locked, and the lock indicator +LOCK 72 is asserted. In this mode, the clock input to the frequency up-down counter 160 is disabled which in turn locks out the coarse frequency tuning used in the Frequency Acquisition mode. Latch 126 sets shift-register 170 and is itself set by a delayed signal originating from the frequency divider 30.

Frequency Acquisition Mode

If a large frequency difference exists between the RCLK 133 and PCLK 110 signals, frequency acquisition (or frequency lock-in) will occur due to cycle slipping in the PLL. Cycle slipping is detected using the transition detector and the quadrature clock QCLK 100. If +QCLK 100 is low when a −TRANS 131 pulse occurs, this indicates that the 0 to 1 or 1 to 0 changes between successive COMP states were caused by the rising edge of PCLK 110 slipping past the falling edge of RCLK 133. This defines a cycle slip mode of operation. When a cycle slip occurs, the PLL cannot determine the direction in which it must change frequency to correct for the error using only the PCLK 110 signal. Therefore, the −QCLK 168 signal is used to disable the clock input to the frequency counter 160 whenever a cycle slip occurs. Since a large frequency error between RCLK and PCLK 110 exists at that time, the walkoff between these two signals will result in relatively long strings of 1's and 0's generated by COMP. After cycle slip, a long string of 1's or 0's will occur at COMP until both falling edges align again, after which a long string of the opposite values 0's or 1's will take place. When the falling edge of PCLK 110 slips past the falling edge of RCLK (not a slip cycle), a pulse will be generated at −TRANS 131 and the frequency counter 160 will be clocked on alternate −TRANS 131 pulses. Frequency Acquisition will remain in effect until the PDAC 152 (Phase DAC) can maintain lock, at which time the lock indicator +LOCK 172 will disable the clock input to the frequency counter 160.

Since there is an overlap of the PDAC 152 (Phase DAC) and the FDAC 162 (Frequency DAC) tuning ranges, it is not necessary that the FDAC be adjusted exactly to the right count. This design feature eases the tracking requirements between the PDAC and FDAC which allows the use of 4 bit DAC's. A limit of 4 bits for the DAC range was specified to maximize yield based on the measured process parameters.

The off-chip reference clock +REF 105 is additionally used to sample the output +PCLK 110 of the frequency divider circuit 30 which is driven by VCO 20. Moreover, it samples the quadrature clock +QCLK 100, which is, likewise, also generated by the frequency divider circuit 30. Reference clock +REF is additionally fed to a latch (block 103) which outputs provide signals of the same frequency but of different phase. This is relevant because the input signal to block 127 needs to be out-of-phase with the signal at +REF 105.

In summary, the first order PLL according to the present invention is implemented using latch FDIT 125 as phase comparator, with inputs +RCLK 133 and +PCLK 110, a phase up-down counter 150, a VCO 20 and a frequency divider circuit 30. Phase samples of +PCLK 110 are taken by the latch FDIT 125 and held at +COMP 123 which controls the direction which the phase up-down counter 150 counts. A transition detector is implemented with a single-shot circuit 137 connected to the up-down counter 150, which emits a pulse at each falling edge transition of the +RCLK clock. The phase up-down counter 150 drives the fine PDAC 152 controlling the VCO 20. The VCO outputs +CLB0 122 and +CLB1 124 drive the frequency divider circuit 30 which generates, respectively +PCLK 110 and +QCLK 100, out-of-phase to each other by 90 degrees and delayed with respect to each other by half a cycle (via delay block 40).

The Sequential Phase Error Detector circuit (SPED) is likewise implemented in its preferred embodiment by latch FDITH 127 which holds the previous phase sample +Q2. Similarly, latch FDITH 126, with an input provided by the delayed signal generated by the frequency divider 30, stores the value of +QCLK to provide data to shift-register 170. A transition detector is implemented with a single-shot circuit 129 which emits a pulse −TRANS 131 when the phase samples change from lead to lag or from lag to lead. This pulse probes the frequency up-down counter 160 and the shift register PLLSR 170. Shift-register 170 stores the history of +QCLK (line 100) which detects whether the loop is still cycle slipping. If no cycle slip is detected for three consecutive lead/lag transitions, the loop is locked and +LOCK 172 is raised, thus freezing the frequency up-down counter 160. Frequency counter 160 is active only when +LOCK 172 is low, and is clocked when +QCLK 100 is high, thereby indicating a non-cycle slip event. The output of frequency counter 160 is connected to the coarse FDAC 162 which drives VCO 20, thereby giving the PLL an expanded pull-in range.

The present invention has particular application to the design of a PLL which can pull-in over a wider range of frequencies than present day first order PLL's. As shown, the SPED circuit is instrumental in allowing the PLL to compensate for deviations in the natural frequency of the VCO which occur due to process variations, while at the same time, providing a low-jitter environment which is essential for low error rates.

The Sequential Phase Error Detector (SPED) circuit, in accordance with the present invention, is particularly well suited for a VCO with wide variations of its natural frequency, without which the circuit yield would be severely impacted. More significantly, it permits extending the pull-in range to ±50% of the input reference clock frequency.

By additionally controlling SPED with separate DAC's, for coarse and fine adjustments, coarse and fine adjustment of the frequency of the VCO can be achieved. Rather than requiring a single 8 bit DAC to cover the required range, two separate four-bit DAC's are used, such that the coarse DAC Least Significant Bit (LSB) equals the fine DAC Most Significant Bit (MSB). The MSB of the fine DAC changes the frequency of the VCO by the same amount as the LSB of the coarse DAC. This ensures that the ratio of the output voltage change of the two DAC's will be at most 8. Thus, it becomes possible to relax the precision required for the on-chip resistors, a significant advantage in the process and manufacture of an integrated monolithic chip.

The PLL described in the present invention requires no system intervention to acquire synchronization on power-up. Furthermore, it also resynchronizes automatically if a noise burst causes the VCO to wander. This self-starting feature is ensured by limiting the allowable VCO frequency range PCLK to between 0.5 to 1.5 times the reference clock RCLK frequency. The VCO frequency, though, must fall within this range to guarantee that the PLL will acquire lock. The operating frequency is limited only by the range of the VCO.

Certain limitations exist in a number of critical timing conditions. The one-shot circuit (block 137) used to generate the pulse at 135 must produce a pulse long enough to update the phase up-down counter 150. Similarly, the pulse at −TRANS 131 must be long enough to update the frequency up-down counter 160. The pulse width for both signals is set by the corresponding inverter chain (block 129). +COMP must be valid to ensure that (135) increments and decrements the counter 150 appropriately, and −RCLK to ascertain that no false transitions are detected.

Preferably, the clock input inside the phase up-down counter 150 should be changed to be identical to the frequency up-down counter 160, thereby allowing the inverter that generates 135 to be removed.

The invention has thus been shown and described with reference to the specific embodiments. However, it should be noted that the present invention is in no way limited to the details of the illustrated structures but changes and modifications may be made within the scope of the appended claims.

What is claimed is:

1. A phaselock loop circuit for locking the phase and frequency of a voltage controlled oscillator to a free-running oscillator, comprising:
   a voltage controlled oscillator (VCO) for creating a signal at a VCO output terminal thereat of predetermined frequency;
   digital phase comparator means for comparing the phase of the VCO output signal to the phase of a signal generated by the free-running oscillator, said comparator means having a first input responsive to the free-running oscillator and an output which controls the VCO; and
   circuit means having a first input for receiving the signal of the free-running oscillator and a second input responsive to the VCO, wherein the relative positioning of the signals of the first and second inputs is compared to each other to detect cycle slip events of the VCO with respect to the free-running oscillator, said circuit means having a third input responsive to the digital phase comparator means and an output driving the VCO for generating a signal that extends the pull-in range of the phaselock loop oscillator by at least ±50% of the frequency of the free-running oscillator.

2. A phaselock loop circuit as in claim 1, further comprising a frequency dividing circuit having an input connected to said VCO output terminal and an output attached to a second input of said digital phase comparator means for dividing the frequency of said VCO by a predetermined amount.

3. A phaselock loop circuit as in claim 2, wherein said frequency dividing circuit is digital and wherein said circuit means comprises a digital sequential phase error detector circuit (SPED).

4. A phaselock loop circuit as in claim 3, wherein said SPED circuit includes a first and second digital-to-analog converter (DAC) for converting digital electrical signals into analog signals for controlling said VCO.

5. A phaselock loop circuit as in claim 4, wherein said first digital-to-analog converter (DAC) provides fine control and said second digital-to-analog converter (DAC) provides coarse control, wherein said first DAC most significant bit equals the least significant bit of said second DAC.

6. A phaselock loop circuit as in claim 4, wherein said digital sequential phase error detector (SPED) circuit comprises two up-down counters connected to the output of said digital phase comparator means, wherein the first of said two up-down counters has a narrow controlling range and is connected to the first of said two digital-to-analog converters having a small voltage output and the second of said two up-down counters has a large controlling range and is connected to the second of said digital-to-analog converters having a large voltage output, and wherein the ratio between said large voltage output and said small voltage output is greater than 1 and less or equal to 8.

7. A phaselock loop circuit as in claim 6, wherein said first of said two up-down counters has a narrow controlling range to control the phase of the output signal of said VCO, and said second of said two up-down counters has a large controlling range to control the frequency of the output signal of said VCO.

8. A phaselock loop circuit as in claim 1, wherein said circuit means further comprises a shift register responsive to said digital phase comparator means to store the value of said digital phase comparator means, thereby providing indication of a phaselock condition between the free-running oscillator and the output of said VCO.

9. A phaselock loop circuit as in claim 6, wherein said digital sequential phase error detector circuit (SPED) further comprises:
   a first single shot circuit driven by the free-running oscillator that detects each level transition of the oscillator and converts said level transition into a pulse, wherein the output of said first single shot circuit is connected to the input of a shift register and to said second (frequency) up-down counter, and
   a second single shot circuit to provide a pulse for every falling edge of the free-running oscillator, and wherein the output of said second single shot drives said first (phase) up-down counter.

10. A phaselock loop circuit as in claim 9, wherein said first and second single shot circuits create pulses of predetermined width.

11. A phaselock loop circuit for locking the phase and frequency of a voltage controlled oscillator to the phase and frequency of a free-running oscillator, comprising:
   a voltage controlled oscillator (VCO) for creating a signal at a VCO output terminal thereat of predetermined frequency;
   digital phase comparator means for comparing the phase of the VCO output signal to the phase of a signal generated by the free-running oscillator, said comparator means having a first input responsive to the free-running oscillator and an output which controls the VCO
   a digital frequency dividing circuit connected to said VCO output terminal and to a second input of said digital phase comparator means, to divide the frequency of said VCO by a predetermined amount; and
   a digital sequential phase error detector circuit (SPED) having a first input adapted to receive the signal of the free-running oscillator and having a second input connected to said digital frequency dividing circuit, said SPED circuit extending the pull-in range of the phaselock loop circuit by at least ±50% of the frequency of the free-running oscillator and detecting cycle slip events of said VCO with respect to said free-running oscillator, and further comprising:
   two up-down counters connected to the output of said digital phase comparator means, wherein the first of said two up-down counters has a narrow controlling range and has an output which is connected through a first digital-toanalog converter having a small voltage output to said VCO, and wherein the second of said two up-down counters has a larger controlling range and has an output which is connected through a second digital-to-analog converter having a large voltage output to said VCO, and wherein the ratio between said large voltage output to said small voltage output is greater than 1 and smaller or equal to 8;

a shift register responsive to the output of said digital phase comparator means to store a value outputted by said digital phase comparator means, thereby providing indication of a frequency lock condition between the free-running oscillator and said output of said VCO;

a first single shot circuit responsive to the free-running oscillator that detects each level transition of said oscillator and converts said level transition into a pulse, and wherein the output of said first single shot circuit is connected to the input of said shift register and to said second up-down counter; and a second single shot circuit responsive to the free-running oscillator to provide a pulse for each falling edge of the free-running oscillator, and wherein the output of said second single shot circuit drives the first up-down counter.

12. A phaselock loop circuit as in claim 11, wherein said SPED circuit is further comprised of:

a latch responsive to said VCO and to said free-running oscillator, said latch driving said first single-shot circuit, said first single-shot circuit generating a signal that clocks said shift-register and said second up-down counter, wherein said VCO is pulled towards synchronization with respect to said free-running oscillator when a cycle slip event is detected.

* * * * *